United States Patent
Wikander et al.

(10) Patent No.: US 9,313,875 B2
(45) Date of Patent: Apr. 12, 2016

(54) CONFORMAL COATING INCLUDING EMBEDDED THERMAL ENERGY ABSORBING MATERIAL

(71) Applicant: INTEL CORPORATION, Santa Clara, CA (US)

(72) Inventors: Jered H. Wikander, Portland, OR (US); Mark MacDonald, Beaverton, OR (US); Shawn S. McEuen, Portland, OR (US); Harish Jagadish, Bangalore (IN); David Pidwerbecki, Hillsboro, OR (US)

(73) Assignee: INTEL CORPORATION, Santa Clara, CA (US)

( * ) Notice: Subject to any disclaimer, the term of this patent is extended or adjusted under 35 U.S.C. 154(b) by 353 days.

(21) Appl. No.: 13/976,438

(22) PCT Filed: Dec. 11, 2012

(86) PCT No.: PCT/US2012/069003
§ 371 (c)(1),
(2) Date: Jun. 26, 2013

(87) PCT Pub. No.: WO2013/090286
PCT Pub. Date: Jun. 20, 2013

(65) Prior Publication Data
US 2014/0285967 A1    Sep. 25, 2014

(30) Foreign Application Priority Data
Dec. 14, 2011 (IN) ............... 3639/DEL/2011

(51) Int. Cl.
*H05K 5/00*     (2006.01)
*G06F 1/16*     (2006.01)
(Continued)

(52) U.S. Cl.
CPC ............ *H05K 1/0209* (2013.01); *G06F 1/1656* (2013.01); *G06F 1/203* (2013.01); *H05K 3/00* (2013.01); *H05K 7/2039* (2013.01)

(58) Field of Classification Search
CPC ......... H05K 7/00; H05K 7/20; H05K 7/2039; H05K 3/00; H05K 1/0209; G06F 1/203
USPC ............... 361/679.02, 679.54, 705, 765, 793, 361/679.21; 262/272.14; 29/592.1, 825, 29/885
See application file for complete search history.

(56) References Cited

U.S. PATENT DOCUMENTS

| | | |
|---|---|---|
| 4,911,232 A | 3/1990 | Colvin et al. |
| 5,714,837 A | 2/1998 | Zurn et al. |

(Continued)

FOREIGN PATENT DOCUMENTS

| | | |
|---|---|---|
| TW | 200948169 | 11/2009 |
| TW | M401535 | 4/2011 |

OTHER PUBLICATIONS

International Search Report and Written Opinion, Mailed Date: Mar. 25, 2013, Application No. PCT/US2012/069003, Filed Date: Dec. 11, 2012, pp. 9.

Office Action and Search Report received for Taiwanese Patent Application No. 101145991, mailed Jun. 5, 2015, 5 pages (untranslated).

*Primary Examiner* — Courtney Smith
*Assistant Examiner* — Zhengfu Feng
(74) *Attorney, Agent, or Firm* — Kacvinsky Daisak Bluni PLLC

(57) ABSTRACT

Examples are disclosed for a conformal coating molded around power source circuitry, electrical components or at least portions of a display for a computing device. The conformal coating to include embedded microencapsulated thermal energy storage material to absorb heat generated by the electrical components.

17 Claims, 5 Drawing Sheets

(51) Int. Cl.
*H05K 7/00* (2006.01)
*H05K 7/20* (2006.01)
*H01S 4/00* (2006.01)
*B29C 45/14* (2006.01)
*H05K 1/02* (2006.01)
*G06F 1/20* (2006.01)
*H05K 3/00* (2006.01)

(56) References Cited

U.S. PATENT DOCUMENTS

| | | |
|---|---|---|
| 5,804,297 A | 9/1998 | Colvin et al. |
| 8,545,929 B2 | 10/2013 | Espenschied et al. |
| 2005/0280987 A1* | 12/2005 | Kwitek et al. ............... 361/687 |
| 2010/0020497 A1* | 1/2010 | Hayakawa et al. ........... 361/705 |

* cited by examiner

CONFORMAL COATING INCLUDING EMBEDDED THERMAL ENERGY ABSORBING MATERIAL

BACKGROUND

Mobile computing devices such as smart phones, tablet personal computers or ultra-mobile personal computers continue to evolve into computing devices that include more power intensive electrical components. These power intensive electrical components such as multi-core processors, graphics processors or system-on-a-chip combinations may not only be power intensive but may generate significant amounts of thermal energy. However, use of cooling fans or other thermal solutions traditionally used with larger form factor computing devices may not be practical in small form factor mobile computing devices. Ineffectively dissipated thermal energy may lead to user discomfort when handling mobile computing devices. Also, throttling back electronic components as a primary thermal control mechanism may severely impact performance and may lead to a reduced user experience.

DETAILED DESCRIPTION

As contemplated in the present disclosure, use of cooling fans or other thermal solutions traditionally used with larger form factor computing devices may not be practical in small form factor mobile computing devices such as smart phones, tablet personal computers or ultra-mobile personal computers. Further, throttling back electronic components may lead to an unsatisfactory user experience. Thus, trying to balance performance with effective thermal management may be problematic in small form factor mobile computing devices.

In some examples, a computing device may include electrical components and a display that may both receive electrical power from power source circuitry. A conformal coating may be molded around the power source circuitry and the electrical components. The conformal coating may substantially seal (e.g., make water resistant) the power source circuitry and the electrical components while also serving as an outer surface for the computing device. Also, for these examples, the conformal coating may include embedded microencapsulated thermal energy storage material to absorb heat generated by the electrical components.

Figure 1:
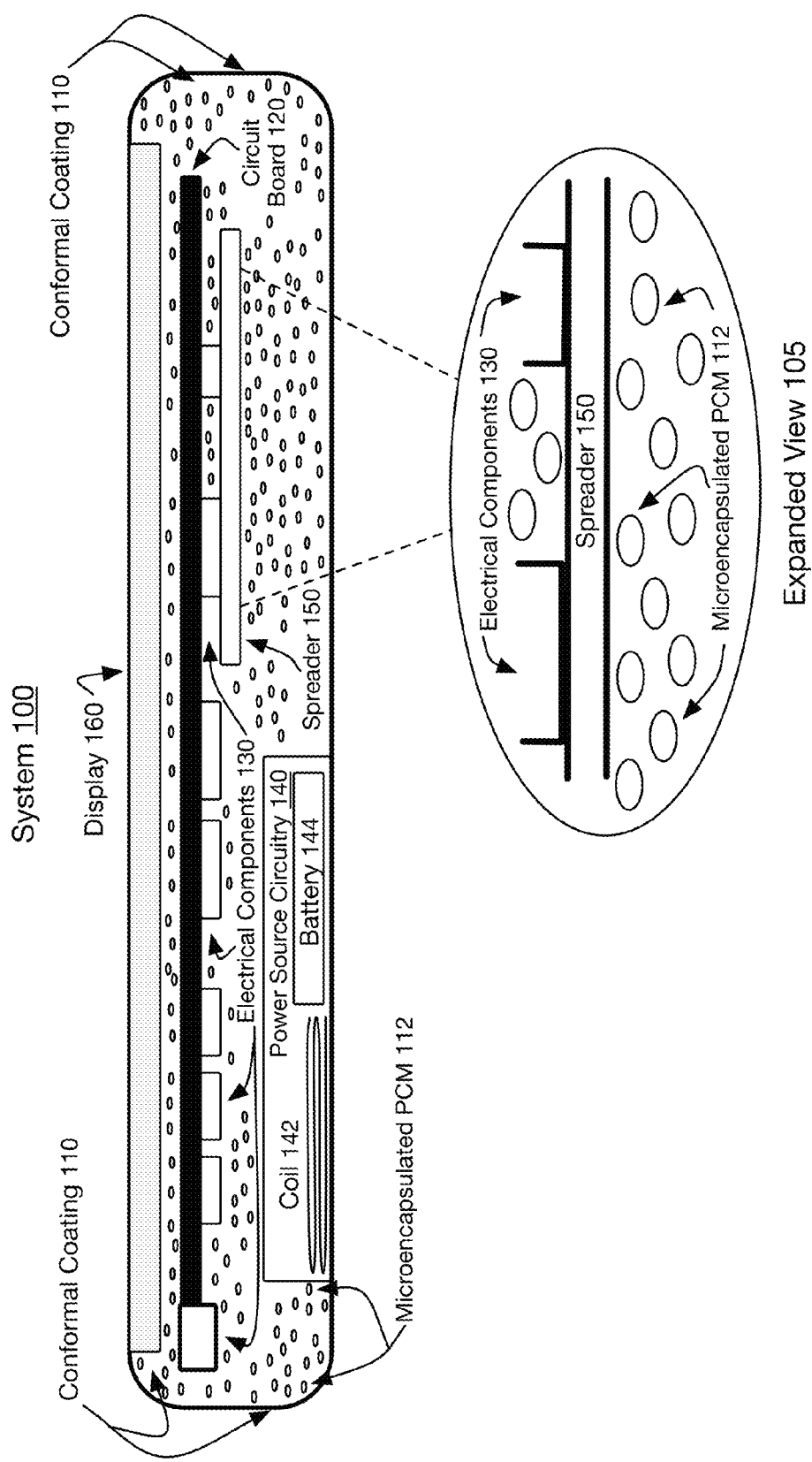
FIG. 1 illustrates an example system.

FIG. 1 illustrates an example system 100. As shown in FIG. 1, system 100 includes conformal coating 110, circuit board 120, electrical components 130, power source circuitry 140, spreader 150 and display 160. Also, as shown in FIG. 1, conformal coating 110 includes microencapsulated phase change material (PCM) 112. In some examples, as described more below, microencapsulated material PCM 112 may be embedded in conformal coating 110 and may serve as a thermal energy storage material to absorb heat generated by elements of system 100 such as electrical components 130, power source circuitry 140 or display 160.

According to some examples, conformal coating 110 may be molded around electrical components 130 situated on circuit board 120 as well as molded around power source circuitry 140. For these examples, conformal coating 110 may seal electrical components 130 and power source circuitry 120 from environmental elements such as water or dust. Also conformal coating 110 may serve as a ruggedized outer surface that may encase or protect electrical components 130 if system 100 were dropped on a hard surface.

In some examples, conformal coating 110 may be molded over edges and/or bonded to display 160 to facilitate the sealing of electrical components 130 and power source circuitry 140. For these examples, display 160 may receive electrical power from power source circuitry 140 and may also be responsive to signals from at least some electrical components 130. Display 160 may include various types of touch input or non-touch input displays to include, but not limited to thin film transistor liquid crystal display (TFT-LCD), organic light emitting diodes (OLED), interferometric modulator display (IMOD), electrophoretic display or other types of flat screen display technologies.

According to some examples, as shown in FIG. 1, power source circuitry 140 includes a coil 142 and a battery 144. Coil 142, for example, may be an inductive coil to generate electrical power when inductively coupled to an induction charger. Also, battery 144 may be configured to store the electrical power generated by coil 142 and then provide that stored power to electrical components 130 or display 160. As mentioned above, conformal coating 110 may seal electrical components 130 and power source circuitry 140. Charging via an inductive coupling allows coil 142 to provide wireless charging of battery 144 while maintaining conformal coating 110's seal. However, in some examples, a coil 142 may be removed and battery 144 may be charged via a power plug receptacle (not shown). For these examples, if a power plug receptacle is included, the power plug receptacle may have a removable cover to assist with maintaining conformal coating 110's seal.

In some examples, as described more below, electrical components 130 may be configured to provide wireless communication capabilities for system 100. Wireless communication capabilities may include both data and/or voice communications to and from system 100. For example, electrical components 130 may include one or more transceivers (not shown) and one or more communication interfaces (also not shown). The one or more communication interfaces may include, but are not limited to, an optical communication interface, a radio frequency (RF) communication interface or an infrared communication interface. Thus, similar to wireless charging of battery 144, for example, wireless communication capabilities may allow data to be received or transmitted from system 100 without physical connectors or ports. As a result of possibly having no physical connectors or ports, conformal coating 110's seal around electrical components 130 and power source circuitry 140 may be maintained.

In some examples, microencapsulated PCM 112 are depicted in FIG. 1 as possibly visible to an unaided human eye to show examples of how microencapsulated PCM 112 may be embedded in conformal coating 110. In some examples, microencapsulated PCM 112 may be in relatively small sizes, e.g., dimensions of only a few microns. These relatively small sizes may not be visible to the unaided human eye when observing the outside surface of conformal coating 110 or even from a cross-section view of conformal coating 110. Also, because of relatively small sizes, a much higher number of microencapsulated PCM 112s may be embedded in conformal coating 110 than what is shown in FIG. 1. For some examples, the percentage of microencapsulated PCM 112s per weight compared to conformal coating 110 may range from a few percentages to higher than 50 percent.

According to some examples, microencapsulated PCM 112 may be embedded in conformal coating 110 as a thermal energy storage material. Examples of thermal energy storage materials that might be used to absorb heat and possibly later release the heat include waxes (such as paraffin wax, octadecane, eicosane, etc.), vegatable extracts, polyethylene glycol, hydrated salts (such as Glauber's salt), fatty acids, esters, ionic liquids or certain polymers. These and other materials may be mixed to achieve different properties. Phase changes for microencapsulated PCM 112 may include solid-liquid transitions, solid-gas transitions, liquid-gas transitions, solid-solid transitions, and liquid-liquid transitions—although some of these phase changes might not be practical for a conformal coating such as conformal coating 110.

Expanded view 105 in FIG. 1 depicts a close-up view of several microencapsulated PCM 112s. In some examples, spreader 150 may be a heat spreader in thermal contact with at least some of electrical components 130. For these examples, the electrical components 130 in thermal contact with spreader 150 may be high thermal emitters such as graphics processors, chipsets or microprocessors. Spreader 150 may help to allow for a more even absorption (e.g., melting) of the thermal energy storage material (e.g., paraffin wax) included in microencapsulated PCM 112. Although FIG. 1 depicts a single spreader 150, any number of other heat spreaders in thermal contact with other electrical components 130 may be contemplated by the present disclosure.

According to some examples, microencapsulated PCM 112 may also assist in maintaining system 100 at a temperature comfortable to a user of system 100. For these examples, a specific melting temperature of the thermal energy storage material included in microencapsulated PCM 112 may be chosen to help maintain these surface temperatures at the temperature comfortable to the user of system 100.

In some examples, system 100 may be a mobile computing device. Examples of a mobile computing device may include an ultra-mobile personal computer, a tablet personal computer, touch pad, portable computer, handheld computer, palmtop computer, personal digital assistant (PDA), cellular telephone, combination cellular telephone/PDA, handheld television, smart device (e.g., smart phone, smart tablet or smart television), mobile internet device (MID), messaging device, data communication device, and so forth.

Figure 2:
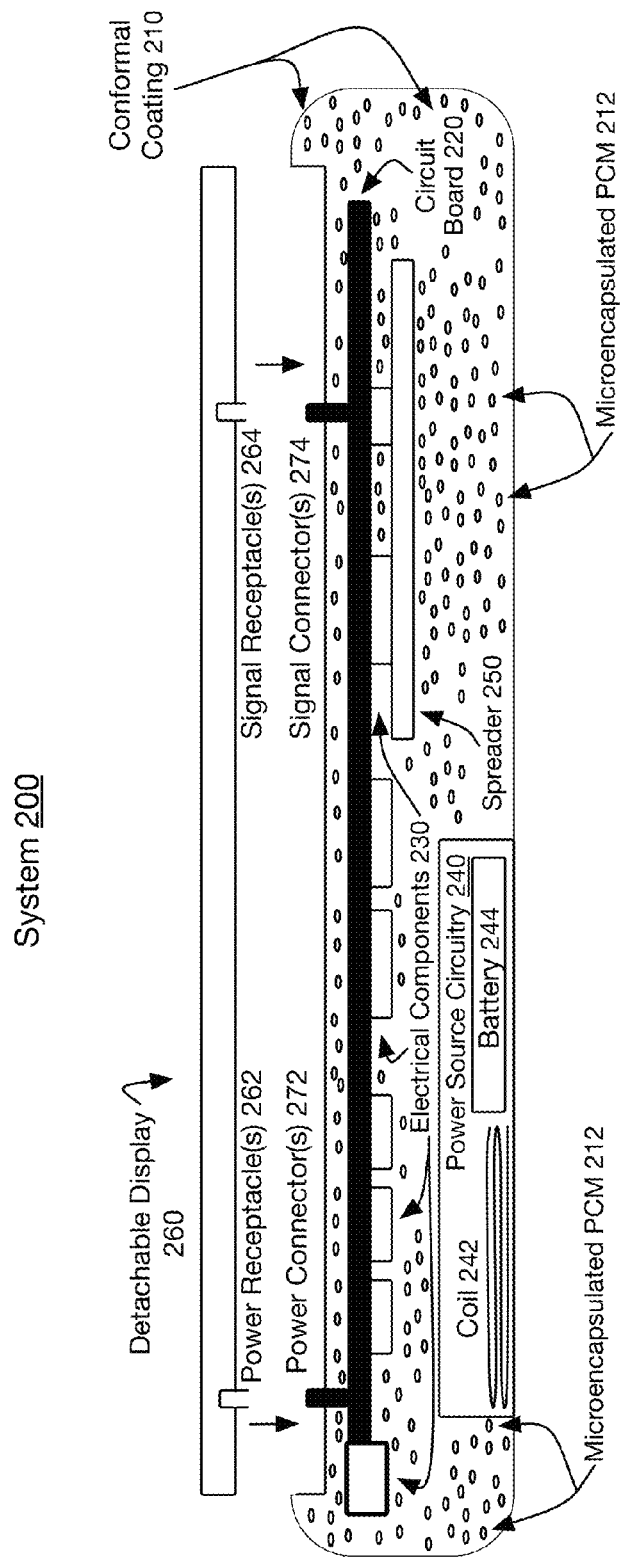
FIG. 2 illustrates an example system with a detachable display.

FIG. 2 illustrates an example system 200 with a detachable display. As shown in FIG. 2, system 200 includes similar elements to system 100 depicted in FIG. 1. For example, system 200 includes conformal coating 210, circuit board 220, electrical components 230, power source circuitry 240 and spreader 250. Conformal coating 210 may include embedded microencapsulated PCM 212 to serve as a thermal energy storage material to absorb heat generated by elements of system 200. Also, as shown in FIG. 2, power source circuitry 240 may include a coil 242 and a battery 244.

In some examples, as shown in FIG. 2, system 200 includes detachable display 260 having power receptacle(s) 262 and signal receptacle(s) 264 to detachably couple to power connector(s) 272 and signal connector(s) 274, respectively. For these examples, detachable display 260 may enable system 200 to have a replaceable display if detachable display 260 becomes broken or damaged. Power connector(s) 272 and signal connector(s) 274 may be configured to route power and signals to detachable display 260 when attached or coupled via power receptacle(s) 262 and signal receptacle(s) 264. In addition to routing power and signals to detachable display 260, power connector(s) 272 and signal connector(s) 274 may also maintain a seal formed by conformal coating 210 around electrical components 230 and power source circuitry 240 when coupled to power receptacle(s) 264. In some examples, power connector(s) 272 and signal connector(s) 274 may be combined to form a single connector configured to provide both power and signals.

Similar to display 160, detachable display 260 may include various types of touch input or non-touch input displays to include, but not limited to TFT-LCD, OLED, IMOD, electrophoretic display or other types of flat screen display technologies.

In some examples, although not shown in FIG. 2, detachable display 260 may allow for access to other components of system 200. For example, battery 244 or one or more of electrical components 230 may be accessible once detachable display 260 is detached.

Figure 3:
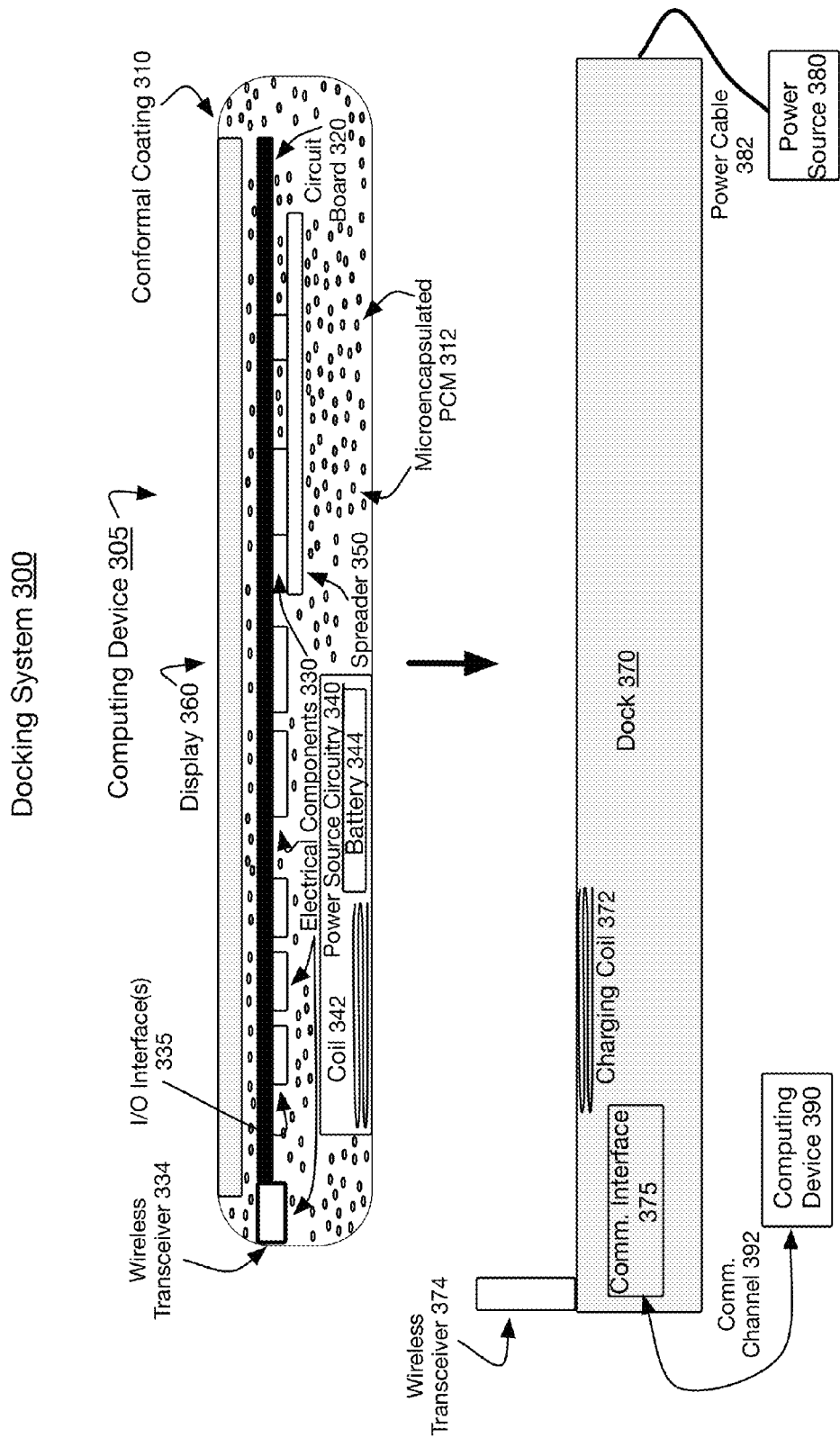
FIG. 3 illustrates an example docking system.

FIG. 3 illustrates an example docking system 300. As shown in FIG. 3, docking system 300 includes a computing device 305 that is similar to system 100 and system 200 shown in FIGS. 1 and 2. Docking system 300 also includes a dock 370 coupled to a power source 380 via power cable 382 and coupled to computing device 390 via communication channel 390.

According to some examples, as shown in FIG. 3, dock 370 includes a charging coil 372. Also charging coil 372 is shown in FIG. 3 as connected to power source 380 via power cable 382. For these examples, power source 380 may include a source of power (e.g., 110-240 volt household power or a large battery) sufficient to allow charging coil 372 to inductively couple to coil 342 and cause coil 342 to generate enough power to charge battery 344. In order to inductively couple, for example, computer device 305 may be placed on dock 370 to put coil 342 near charging coil 372.

In some examples, electrical components of computing device 305 may be configured to include a transceiver 334 and input/output (I/O) interface(s) 335 to provide wireless communication capabilities. For these examples, I/O interface(s) 335 may include an optical communication interface, an RF communication interface or an infrared communication interface to enable computing device to wirelessly communicate via optical, RF or infrared communication mediums according to applicable communication protocols designed for these types of wireless communication mediums.

According to some examples, dock 370 may include a transceiver 374 and a communication interface 375. When computing device 305 is placed on dock 370 and/or is communicatively coupled to computing device 305, transceiver 374 may be configured to receive wireless communication signals from computing device 305. For these examples, communication interface 375 may relay the received communications via communication channel 392 to computing device 390. As mentioned above, these wireless communication signals may be transmitted from computing device 305 via optical, RF or infrared communication mediums. In some examples, communications may also be relayed between computing device 305 and computing device 390 in order to synch the two devices or exchange other types of information or data.

In some examples, communication channel 392 includes wired or wireless communication channels to relay the communications received from computing device 305 to computing device 390. For these examples, communication interface 375 may be configured to relay the communications according to applicable communication protocols designed for these types of wired or wireless communication mediums.

Figure 4:
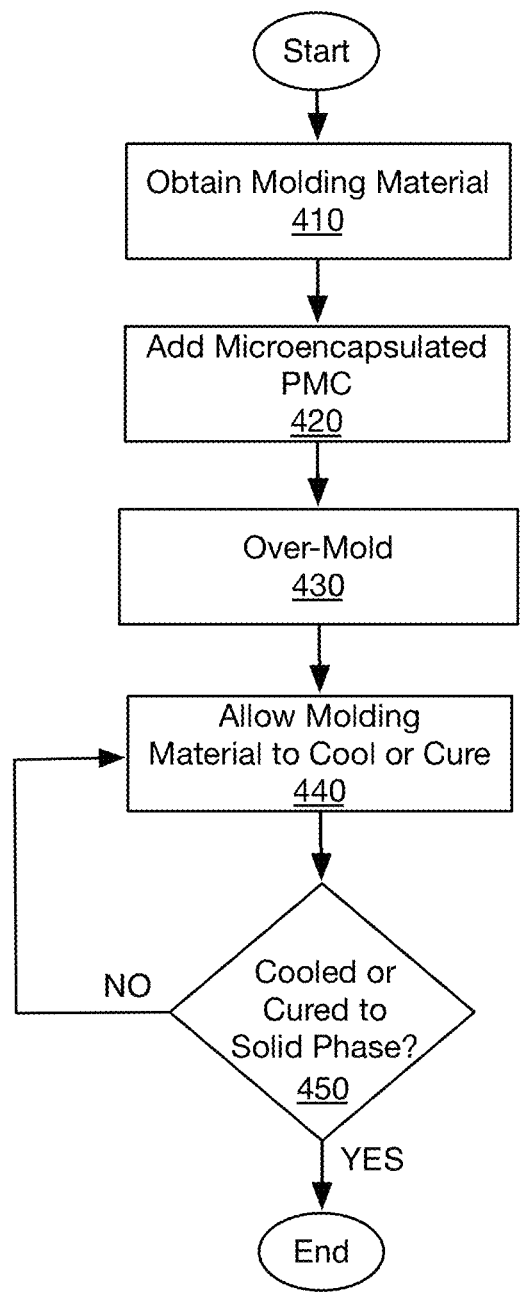
FIG. 4 illustrates a flow chart of example operations for over-molding power source circuitry and electrical components of a computing device.

FIG. 4 illustrates a flow chart of example operations for over-molding power source circuitry and electrical components of a computing device. In some examples, elements of systems 100, 200 and 300 shown in FIGS. 1-3 may be used to illustrate example operations related to the flow chart depicted in FIG. 4. But the described operations are not limited to implementations using elements of systems 100, 200 or 300.

Moving from the start to block 410 (Obtaining Molding Material), molding material that eventual forms conforming coating 110 may obtained. In some examples the molding material may be heated to a temperature to cause the molding material to be in a liquid phase. In other examples, the molding material may be epoxy material that may already be in a liquid phase. In some examples, the molding material may include a type of thermoset material. For these examples, the thermoset material may include a polymer-based material that may include but is not limited to plastics, rubbers or epoxies. The thermoset material, for example, may have a relatively low melting point or, as mentioned above, initially be in a liquid phase.

Proceeding from block 410 to block 420 (Add Microencapsulated PCM), once the molding material is in the liquid phase, microencapsulated PCMs may be added to the molding material. In some examples, the microencapsulated PCMs may be similar to microencapsulated PCM 112, 212 or 312 depicted in FIGS. 1-3. For these examples, adding the microencapsulated PCMs while the molding material is in the liquid phase may embed the microencapsulated PCMs in the molding material.

According to some examples, the thermoset material used for the molding material may have a relatively low initial melting point or may already be in a liquid phase. For these examples, when the microencapsulated PCMs are added, the microencapsulated PCMs may stay in a solid phase. As a result of staying in a solid phase, the microencapsulated PCMs may be better distributed or more evenly mixed into the molding material.

Proceeding from block 420 to block 430 (Over-Mold), power source circuitry and electrical components of a system such as system 100 or system 200 may be over-molded with the liquid phase molding material having the microencapsulated PCMs. In some examples, the power source circuitry and electrical components may be placed in a mold shaped as a handheld computing device or a tablet personal computer. One or more heat spreaders may also be situated on or near one or more electrical components within the mold. The liquid phase molding material may then be poured around the power source circuitry, the electrical components and the one or more heat spreaders. The over-molding may result in a conformal coating to seal the power source circuitry and the electrical components and form a rigid outer surface once the molding material cools and returns to a solid phase. In some examples, additional, cosmetic-like layers (possibly composed of different materials) may be added to the rigid outer surface to give the handheld computing device or the tablet personal computer a more finished look.

Proceeding from block 430 to block 440 (Allow Molding Material to Cool or Cure), the molding material may now be allowed to cool or cure.

Proceeding from block 440 to decision block 450 (Cooled or Cured to Solid Phase?), a determination may be made as to whether the molding material has cooled or cured to a solid phase. If the molding material has not cooled or cured, the process moves back to block 440. Otherwise, if the molding has cooled or cured to a solid phase the process comes to an end. In some examples, the molding material has cooled or cured to a solid phase. For these examples, the conformal coating may form a rigid outer surface. In some examples, the thermoset material used in this over-molding process may be cured (e.g., via chemical reaction, irradiation or thermal treatment) to bring the molding material to a solid phase and to also raise the temperature needed to cause the conformal coating to reach a melting point or return to a liquid phase. The curing, for example, may raise the melting point to a temperature substantially higher than the melting point for the embedded microencapsulated PCMs. This raised melting point may also be substantially higher than anticipated operating temperatures for the electrical components sealed by the conformal coating.

Figure 5:
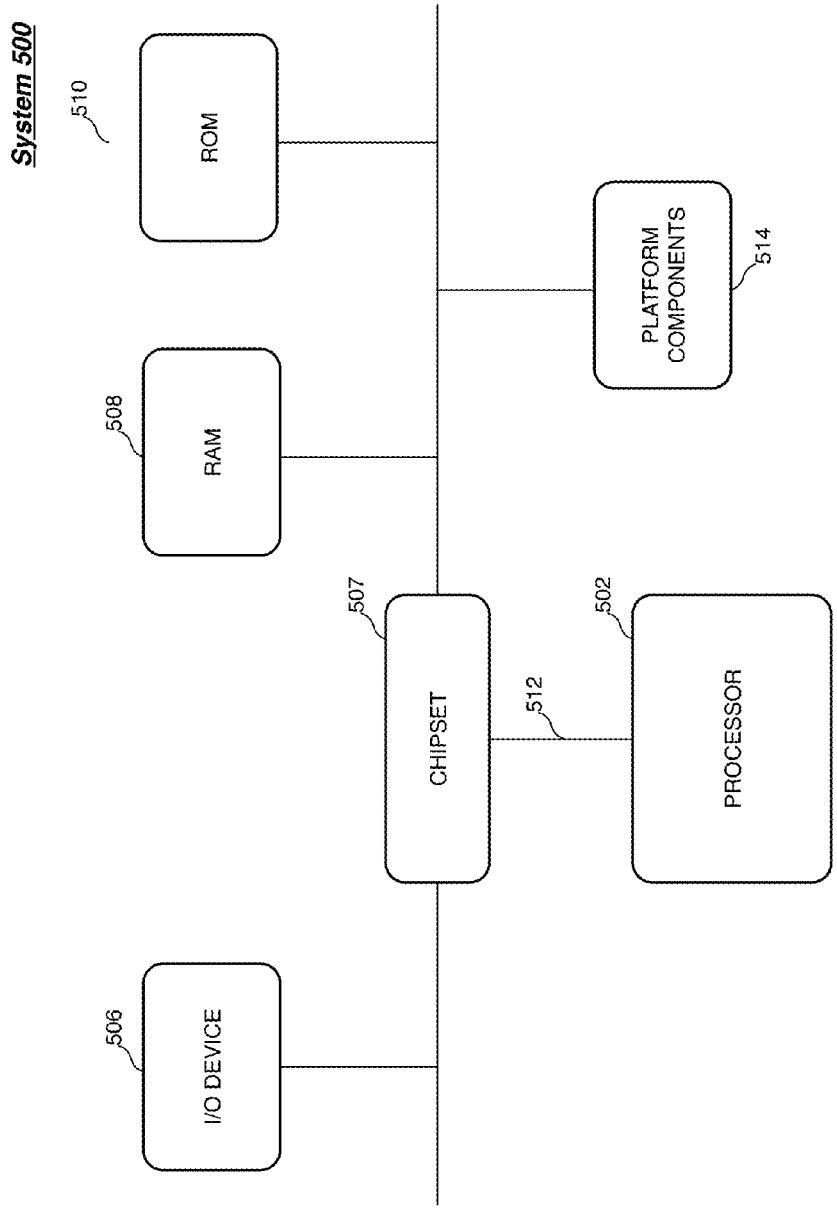
FIG. 5 illustrates an example system for a computing device.

FIG. 5 is a diagram of an example system 500 for a computing device. In particular, FIG. 5 is a diagram showing a system 500, which may include various elements that were broadly described above as electrical components, power source circuitry, spreaders, displays, etc. For instance, FIG. 5 shows that system 500 may include a processor 502, a chipset 504, an input/output (I/O) device 506, a random access memory (RAM) (such as dynamic RAM (DRAM)) 508, and a read only memory (ROM) 510, and various platform components 514 (e.g., a heat sink, DTM system, cooling system, housing, vents, and so forth). These elements may be implemented in hardware, software, firmware, or any combination thereof. The embodiments, however, are not limited to these elements.

As shown in FIG. 5, I/O device 506, RAM 508, and ROM 510 are coupled to processor 502 by way of chipset 504. Chipset 504 may be coupled to processor 502 by a bus 512. Accordingly, bus 512 may include multiple lines. In various examples, chipset 504 may be integrated or packaged with processor 502. Other examples are described and claimed.

Processor 502 may be a central processing unit including one or more processor cores and may have any number of processors including any number of processor cores. The processor 502 may include any type of processing unit, such as, for example, CPU, multi-processing unit, a reduced instruction set computer (RISC), a processor that have a pipeline, a complex instruction set computer (CISC), digital signal processor (DSP), and so forth.

Although not shown, the system 500 may include various interface circuits, such as a wireless Ethernet interface and/or an optical interface, and/or the like. In some exemplary embodiments, the I/O device 506 may include one or more input devices connected to interface circuits for entering data and commands into the system 500. For example, the input devices may include a keyboard, mouse, touch screen, track pad, track ball, isopoint, a voice recognition system, and/or the like. Similarly, the I/O device 506 may include one or more output devices wirelessly connected to the interface circuits for outputting information to an operator. For example, the output devices may include one or more displays, printers, speakers, and/or other output devices, if desired. For example, one of the wirelessly connected output devices may be a display. The display may be a cathode ray tube (CRTs), liquid crystal displays (LCDs), or any other type of display.

The system 500 may also have a wireless network interface to exchange data with other devices via a connection to a network. The network connection may be any type of network connection, such as a wireless Ethernet connection. The network may be any type of network, such as the Internet, a telephone network, a cable network, a wireless network, a packet-switched network, a circuit-switched network, and/or the like.

Various examples may be implemented using hardware elements, software elements, or a combination of both. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth. Examples of software may include software components, programs, applications, computer programs, application programs, system programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints.

Various examples may be implemented using hardware elements, software elements, or a combination of both. In some examples, hardware elements may include devices, components, processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), memory units, logic gates, registers, semiconductor device, chips, microchips, chip sets, and so forth. In some examples, software elements may include software components, programs, applications, computer programs, application programs, system programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given implementation.

Some examples may be described using the expression "in one example" or "an example" along with their derivatives. These terms mean that a particular feature, structure, or characteristic described in connection with the example is included in at least one example. The appearances of the phrase "in one example" in various places in the specification are not necessarily all referring to the same example.

Some examples may be described using the expression "coupled" and "connected" along with their derivatives. These terms are not necessarily intended as synonyms for each other. For example, descriptions using the terms "connected" and/or "coupled" may indicate that two or more elements are in direct physical or electrical contact with each other. The term "coupled," however, may also mean that two or more elements are not in direct contact with each other, but yet still co-operate or interact with each other.

It is emphasized that the Abstract of the Disclosure is provided to comply with 37 C.F.R. Section 1.72 (b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single example for the purpose of streamlining the disclosure. This method of disclosure is not to be interpreted as reflecting an intention that the claimed examples require more features than are expressly recited in each claim. Rather, as the following claims reflect, inventive subject matter lies in less than all features of a single disclosed example. Thus the following claims are hereby incorporated into the Detailed Description, with each claim standing on its own as a separate example. In the appended claims, the terms "including" and "in which" are used as the plain-English equivalents of the respective terms "comprising" and "wherein," respectively. Moreover, the terms "first," "second," "third," and so forth, are used merely as labels, and are not intended to impose numerical requirements on their objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An apparatus comprising:
   electrical components;
   power source circuitry electrically coupled to the electrical components, the power source circuitry comprising an inductive coil and a battery to store electrical power to be generated by the inductive coil when inductively coupled to an induction charger; and
   a conformal coating molded around the electrical components to substantially seal the electrical components while also serving as an outer surface of the apparatus, the conformal coating including microencapsulated thermal energy storage material embedded in the conformal coating to absorb heat generated by the electrical components.

2. An apparatus of claim 1, the conformal coating also molded around the power source circuitry.

3. The apparatus of claim 2, comprising a display to receive electrical power from the power source circuitry and responsive to signals from at least one of the electrical components, the conformal coating molded around at least a portion of one or more outward facing edge of the display to form a unibody chassis.

4. The apparatus of claim 3, comprising the electrical components configured to provide wireless communication capabilities to include at least one transceiver and at least one of an optical communication interface, a radio frequency communication interface or an infrared communication interface.

5. The apparatus of claim 4, the apparatus a handheld computing device.

6. An apparatus comprising:
   electrical components;
   a conformal coating molded around the electrical components to substantially seal the electrical components while also serving as an outer surface of the apparatus, the conformal coating including microencapsulated thermal energy storage material embedded in the conformal coating to absorb heat generated by the electrical components; and a display responsive to signals from at least one of the electrical components, the display to detachably couple to the outer surface of the conformal coating and to receive the signals via one or more connectors routed through the outer surface of the conformal coating.

7. The apparatus of claim 6, the apparatus a handheld computing device.

8. The apparatus of claim 1, the electrical components to provide wireless communication capabilities to include at least one transceiver and at least one of an optical communication interface, a radio frequency communication interface or an infrared communication interface.

9. The apparatus of claim 1, comprising the conformal coating including a thermoset material, the microencapsulated thermal energy storage material added to the thermoset material in a liquid phase to embed the microencapsulated thermal energy storage material, the thermoset material in the liquid phase then molded around the electrical components to result in the conformal coating once the thermoset material is caused to be in a solid phase.

10. The apparatus of claim 9, comprising the thermoset material to include a polymer-based material.

11. The apparatus of claim 1, comprising the conformal coating including a thermoset material that was heated to cause the thermoset material to be in a liquid phase, the microencapsulated thermal energy storage material added to the thermoset material in the liquid phase to embed the microencapsulated thermal energy storage material, the thermoset material in the liquid phase then molded around the electrical components to result in the conformal coating once the thermoset material returns to a solid phase.

12. The apparatus of claim 1, comprising the microencapsulated thermal energy storage material to include paraffin wax.

13. The apparatus of claim 1, comprising a heat spreader in thermal contact with at least one of the electrical components, the conformal coating also molded around the heat spreader.

14. A method comprising:
obtaining a molding material that is in a liquid phase;
adding microencapsulated thermal energy storage material to the molding material to embed the microencapsulated thermal energy storage material in the molding material; and
over-molding electrical components and power source circuitry of a computing device with the liquid phase molding material having the embedded thermal storage material, the over-molding to result in a conformal coating to substantially seal the electrical components and the power source circuitry to form an outer surface of the computing device once the molding material is cooled or cured to cause the molding material to be in a solid phase, the power source circuitry comprising an inductive coil and a battery to store electrical power to be generated by the inductive coil when inductively coupled to an induction charger, the battery electrically coupled to the electrical component to provide electrical power to the electrical components.

15. The method of claim 14, comprising adding one or more connectors to enable a display to detachably couple to the outer surface and also to receive signals from at least one of the electrical components.

16. The method of claim 14, comprising also over-molding at least a portion of one or more outward facing edges of a display, the display to receive signals from at least one of the electrical components, the over-molding of the display to result in the conformal coating forming a unibody chassis once the molding material cools or is cured to cause the molding material to be in a solid phase.

17. The method of claim 14, comprising the molding material including a type of thermoset material to include a polymer-based material and the microencapsulated thermal energy storage material including paraffin wax.

* * * * *